(12) United States Patent
Kim et al.

(10) Patent No.: US 6,794,306 B2
(45) Date of Patent: Sep. 21, 2004

(54) SEMICONDUCTOR DEVICE HAVING GATE ALL AROUND TYPE TRANSISTOR AND METHOD OF FORMING THE SAME

(75) Inventors: Sang-Su Kim, Kimpo-shi (KR); Tae-Hee Choe, Seoul (KR); Hwa-Sung Rhee, Seoul (KR); Geum-Jong Bae, Kyunggi-do (KR); Nae-In Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 23 days.

(21) Appl. No.: 10/463,554

(22) Filed: Jun. 17, 2003

(65) Prior Publication Data

US 2003/0215989 A1 Nov. 20, 2003

Related U.S. Application Data

(62) Division of application No. 10/039,151, filed on Jan. 3, 2003, now Pat. No. 6,605,847.

(30) Foreign Application Priority Data

Apr. 12, 2001 (KR) ........................................ 2001-19525

(51) Int. Cl.$^7$ ...................... H01L 21/00; H01L 21/302; H01L 21/461
(52) U.S. Cl. ...................................... 438/752; 438/933
(58) Field of Search ................................. 438/752, 933

(56) References Cited

U.S. PATENT DOCUMENTS

| | | | | |
|---|---|---|---|---|
| 4,996,574 A | * | 2/1991 | Shirasaki | 257/66 |
| 5,324,960 A | * | 6/1994 | Pfiester et al. | 257/67 |
| 5,963,800 A | * | 10/1999 | Augusto | 438/212 |
| 6,495,403 B1 | * | 12/2002 | Skotnicki et al. | 438/157 |
| 6,521,949 B2 | * | 2/2003 | Assaderaghi et al. | 257/347 |
| 2003/0122154 A1 | * | 7/2003 | Babcock et al. | 257/197 |

* cited by examiner

*Primary Examiner*—W. David Coleman
(74) *Attorney, Agent, or Firm*—Mills & Onello LLP

(57) ABSTRACT

A semiconductor device having a transistor of gate all around (GAA) type and a method of fabricating the same are disclosed. A SOI substrate composed of a SOI layer, a buried oxide layer and a lower substrate is prepared. The SOI layer has at least one unit dual layer of a silicon germanium layer and a silicon layer. The SOI layer is patterned to form an active layer pattern to a certain direction. An insulation layer is formed to cover the active layer pattern. An etch stop layer is stacked on the active layer pattern covered with the insulation layer. The etch stop layer is patterned and removed at a gate region crossing the active layer pattern at the channel region. The insulation layer is removed at the gate region. The silicon germanium layer is isotropically etched and selectively removed to form a cavity at the channel region of the active layer pattern. In the state that the silicon germanium layer is selectively removed, a gate insulation layer is formed to cover the exposed surface of the active layer pattern. A gate conductivity layer is stacked on the substrate by a chemical vapor deposition (CVD) to fill the gate region including the cavity. The middle part of the channel region of the active layer pattern can be patterned to be divided by multiple patterns that are formed in a line.

7 Claims, 17 Drawing Sheets

SEMICONDUCTOR DEVICE HAVING GATE ALL AROUND TYPE TRANSISTOR AND METHOD OF FORMING THE SAME

RELATED APPLICATION

This application is a divisional of U.S. application Ser. No. 10/039,151, now U.S. Pat. No. 6,605,847 filed on Jan. 3, 2003, the contents of which are herein incorporated by reference in their entirety.

This application relies for priority upon Korean Patent Application No. 2001-19525, filed on Apr. 12, 2001, the contents of which are herein incorporated by reference in their entirety.

FIELD OF THE INVENTION

The present invention relates to a semiconductor device having a gate all around type transistor and to a method of fabricating the same.

BACKGROUND OF THE INVENTION

As semiconductor devices become more highly integrated, many methods have been developed in order to reduce the size of an individual device formed on a semiconductor substrate and to maximize device performance. One such method involves using a silicon on insulator (SOI) type substrate, and another method involves forming three-dimensional devices such as vertical transistors.

In the case of using the SOI type substrate, it is possible to perfectly isolate devices and thus prevent neighboring devices in a highly integrated semiconductor device structure from affecting each other. Further, the method of using the SOI type substrate provides higher electric pressure resistivity than device region isolation using a junction method, and can reduce the problem of current being generated at a junction under high radiation environment.

However, as representative methods of forming the three-dimensional device, there are a fully depleted lean-channel transistor (DELTA) structure and a gate all around (GAA) structure. A metal oxide semiconductor field effect transistor (MOSFET) of the DELTA structure is disclosed in the U.S. Pat. No. 4,996,574. In the DELTA structure, an active layer forming a channel is formed to have constant width and to be vertically protruded. A gate electrode is formed to surround the vertically protruded channel part. Thus, the height of the protruded part becomes the channel width, and the width of the protruded part becomes the channel layer thickness. In the formed channel, the both sides of the protruded part can be used to get the effect that the channel width is doubled. Thus, it is possible to prevent channel width decrease in accordance with reduction of a device region and thereby, a narrow channel effect in a conventional transistor.

Also, in the case of reducing the width of the protruded part, channel depletion area formed at the both sides can be overlapped, and thus, there is an effect that channel conductivity increases.

But, in the event that a semiconductor device of DELTA structure is embodied at a bulk type silicon substrate, the substrate is manufactured to protrude a part that forms a channel at the substrate, and substrate oxidation is performed at the state that the protruded part is covered with an oxidation barrier layer. If over-oxidation is performed, a part connecting the protruded part and the substrate body is oxidized by oxygen laterally diffused from another part not protected by an oxidation barrier layer. Thus, the channel is isolated from the semiconductor substrate body. In this process, the channel is separated by over-oxidation to make thickness of channel toward the connecting part low. Thus, there is a problem that single crystal layer is damaged by the pressure of the oxidation process.

In the case of using a SOI type substrate for forming a DELTA structure, a SOI layer is etched to have narrow width and form a channel. Thus, it is possible to solve the problem resulting from the over-oxidation occurring when a bulk type substrate is used. But, in case of using the SOI type substrate, consequently, the channel width is limited by the thickness of the SOI layer. A SOI type substrate of a fully depletion type for a highly integrated semiconductor device has a thickness of the SOI layer to be several hundreds angstroms, and thus, there may be a limitation at using the SOI type substrate.

However, according to a GAA structure, an active region pattern is formed of a SOI layer at a conventional SOI type substrate. And, a gate electrode layer is formed to surround a channel part of an active region pattern covered with a gate insulation layer at a gate electrode. Thus, the GAA structure has a similar effect with the DELTA structure.

But, in case of forming the GAA structure, in order to make the gate electrode surround the active region at the channel part, a buried oxide layer under the active region should be etched using an under-cut phenomenon of isotropic etching. In this process, the isotropic etching removes not only a channel bottom of the active region but also bottoms of source/drain regions. Thus, when a gate electrode layer is formed, a gate electrode is formed at the bottoms of not only the channel but also the source/drain regions. Thus, there is a problem that a parasitic capacitance becomes large since the gate electrode is formed at the bottoms of not only the channel but also the source/drain regions when the gate electrode layer is formed.

SUMMARY OF THE INVENTION

Therefore, it is an object of the present invention to provide a semiconductor device having a transistor device and a method of fabricating the same in order to reduce problems of the conventional DELTA and GAA structures, where the transistor device has an effect that widens a channel width by forming a three-dimensional structure.

It is another object of the present invention to provide a semiconductor device having a transistor and a method of fabricating the same, where the transistor can reduce the risk that crystal damage occurs at a channel.

The invention is directed to a semiconductor device having a transistor and a method of fabricating such a device. The transistor is formed on a buried oxide layer of a SOI substrate to a certain direction and divided with three regions, that is, source, channel, and drain regions sequentially. In the source/drain regions, a silicon germanium layer and a silicon layer are stacked and in the channel region, there are an active layer pattern, an insulation layer and a gate electrode. The active layer pattern includes a silicon layer continuing from the source/drain regions, and the insulation layer covers the surface of the active layer pattern at least at the channel region. The gate electrode is formed on the buried oxide layer vertically toward the active layer pattern, surrounding the total channel region of the active pattern.

In the present invention, thickness and composition of an insulation layer formed on the surface of the active layer pattern can be different from those formed on the surfaces of the source/drain regions and the channel region, respectively.

In the present invention, in the active layer pattern on the buried oxide layer, the source/drain regions can be formed by stacking a silicon germanium layer and a silicon layer by one layer, respectively, or by alternatively stacking those layers by multiple layers. In the event that the silicon germanium layer and the silicon layer are alternatively stacked by multiple layers, in the channel region, a conductivity material layer is filled to consist of a gate electrode instead of the silicon germanium layer, and the silicon layer is positioned to continue with the silicon layer of the source/drain regions. An insulation layer functioning of a gate insulation layer interposes between the silicon layer and the conductivity material layer composing of the gate electrode.

In the present invention, the active region can be divided with multiple parts formed to a certain direction at the channel region, differently from that the active region forms one pattern at the source/drain regions.

The object can be achieved by a method of fabricating the semiconductor device according to the present invention. The method includes the following steps. A SOI substrate including a SOI layer, a buried oxide layer, and a bottom substrate layer is prepared, where the SOI layer has at least one unit dual layer formed by overlapping a silicon germanium layer and a silicon layer. The SOI layer is patterned to form the active layer pattern to a certain direction. An etch stop layer is stacked on the active layer pattern. The etch stop layer is patterned and removed at the gate region that crosses the active layer pattern at the channel region. The silicon germanium layer is selectively removed to form a cavity at the channel region of the active layer pattern through the isotropic etch. A gate insulation layer is formed to cover the surface of the exposed active layer pattern in the state that the silicon germanium is selectively removed. A gate conductivity layer is stacked on the substrate by a chemical vapor deposition (CVD) to fill the gate region including the cavity.

An insulation layer may be formed to cover the surface of the active layer pattern before stacking the etch stop layer. Then the insulation layer at the gate region should be removed before selectively removing the silicon germanium layer.

In the step where the SOI layer is patterned to form the active layer pattern, a middle part relevant to the channel region of the active layer pattern can be patterned to be divided by multiple patterns formed in a line.

In the present invention, the insulation layer and the gate insulation layer are preferably formed by thermal-oxidizing the surface of the active region composed of the silicon layer and the silicon germanium layer.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

<Embodiment 1>

Figure 1A:
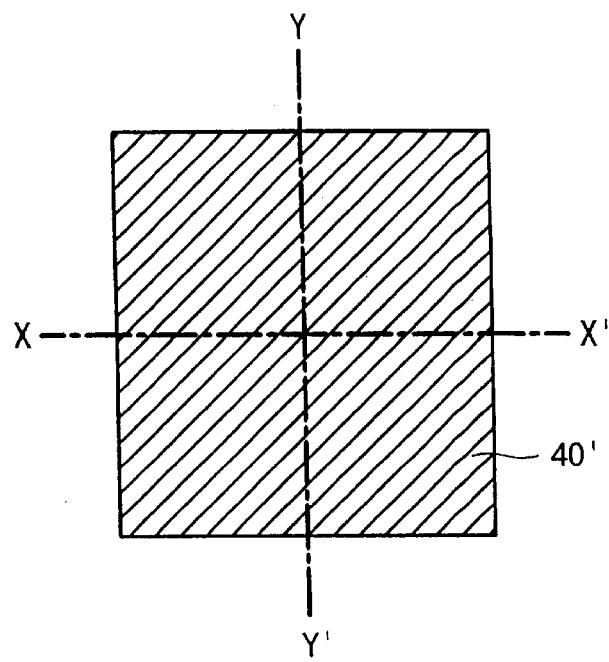
FIGS. 1A, 2A, 3A, 4A, 5A, 6A and 7A are plan views illustrating process steps in accordance with a first embodiment of the present invention.
Figure 1B:
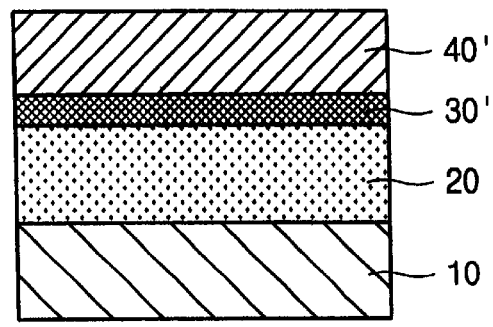
FIGS. 1B, 2B, 3B, 4B, 5B, 6B and 7B are cross-sectional views taken along the X–X' axis of FIGS. 1A, 2A, 3A, 4A, 5A, 6A and 7A, respectively.
Figure 1C:
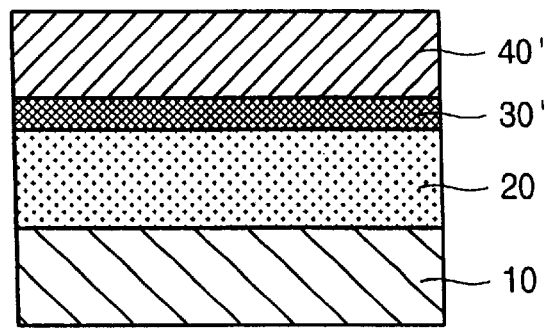
FIGS. 1C, 2C, 3C, 4C, 5C, 6C and 7C are cross-sectional views taken along the Y–Y' axis of FIGS. 1A, 2A, 3A, 4A, 5A, 6A and 7A, respectively.

Referring to FIGS. 1A, 1B and 1C, a SOI substrate is formed of a SOI layer, a buried oxide layer 20, and a semiconductor substrate 10. The SOI layer consists of a silicon germanium layer 30' and a silicon layer 40'. FIG. 1A is a plan view illustrating the SOI substrate. FIGS. 1B and 1C are cross-sectional views illustrating the cross-sections cutting the SOI substrate to X–X' and Y–Y' directions, respectively.

There can be several methods of fabricating the SOI substrate. For example, one method includes the following steps. A thermal oxide layer having certain thickness is formed on the surface of one bulk type substrate. After forming a silicon germanium single crystal layer as an epitaxial layer at another bulk type substrate, two substrates are welded together. The belly side of the bulk type substrate is mostly removed by a chemical-mechanical polishing (CMP) technique.

Figure 2A:
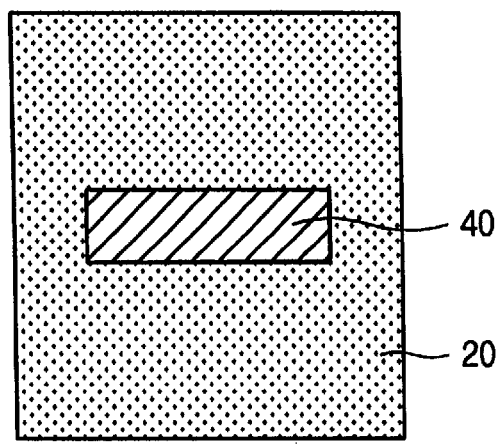
Figure 2B:
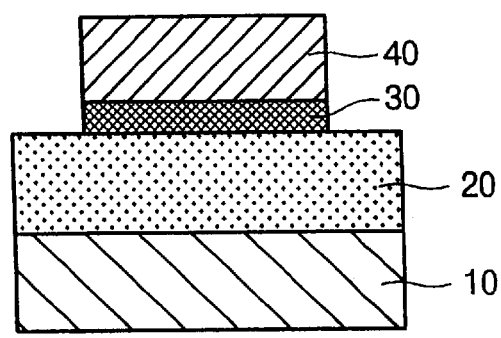
Figure 2C:
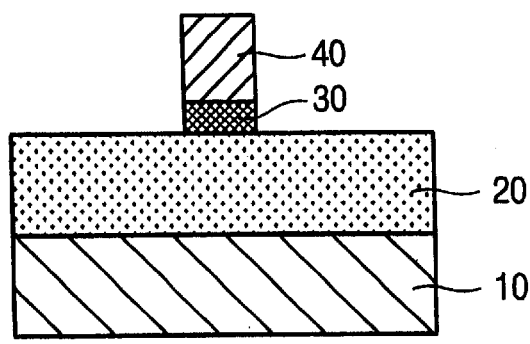

Referring to FIGS. 2A, 2B, and 2C, the SOI layer is patterned to form an active layer patterns 30 and 40. The active layer patterns are formed long to the X—X direction. Width and length of the active layer patterns 30 and 40 can be different as occasion demands. In the event that the silicon germanium single crystal layer is thick and width of the active layer patterns is large, in the subsequent step of removing the silicon germanium single crystal layer, undercut is widened toward the source/drain regions. Thus, it is preferable that thickness of the silicon germanium single crystal layer and width of the active layer patterns should be small. Height is determined when the SOI substrate is formed. Preferably, the thickness of the buried oxide layer is below one micrometer, the thickness of the silicon germanium single crystal layer should be about 1,000 Å below 2,000 Å, and the thickness of the silicon single crystal layer should be 300 Å to 1,500 Å.

Figure 3A:
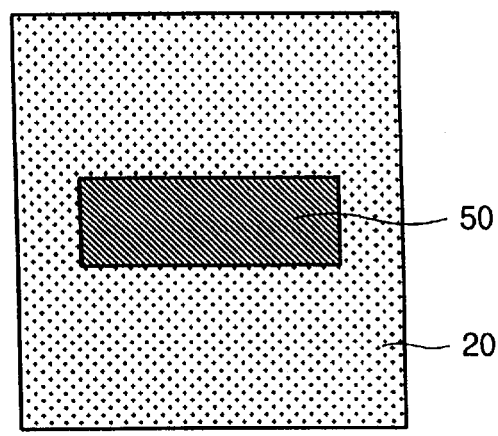
Figure 3B:
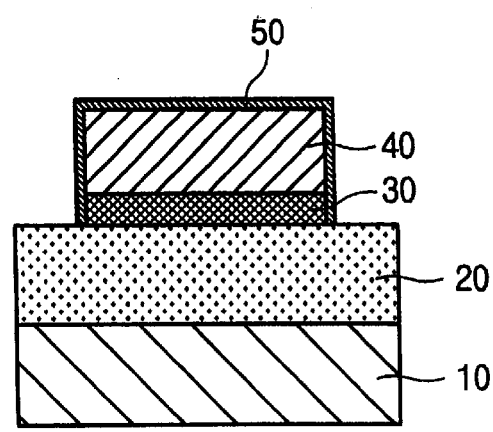
Figure 3C:
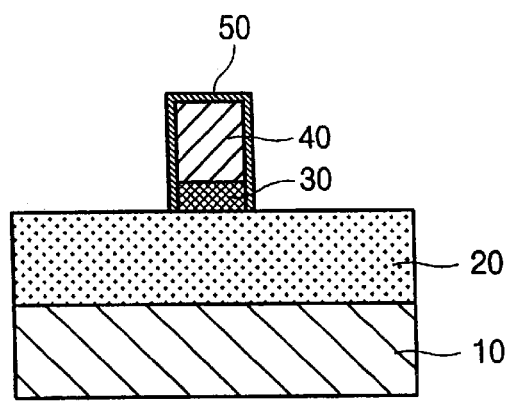

Referring to FIGS. 3A, 3B and 3C, the surface of the active layer patterns 30 and 40 are thermal-oxidized to form an insulation layer 50 to a thickness of about 100 Å. The surface of the active layer patterns 30 and 40 can be nitrified to form the insulation layer 50 under nitrogen ambient. The insulation layer can be deposited at the surface of the active layers by CVD technique. A channel ion-implantation can be performed before or after thermal oxidation.

Figure 4A:
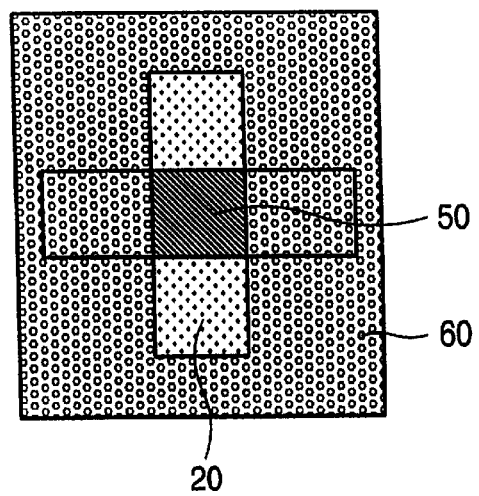
Figure 4B:
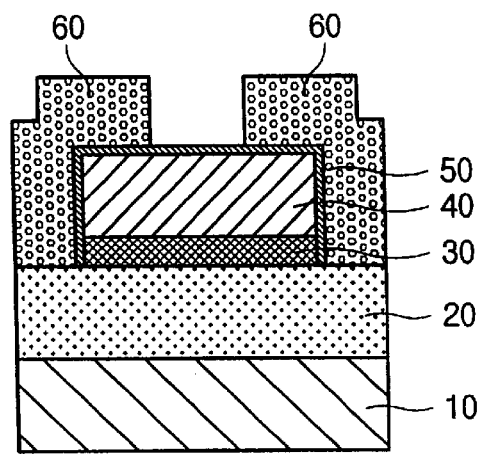
Figure 4C:
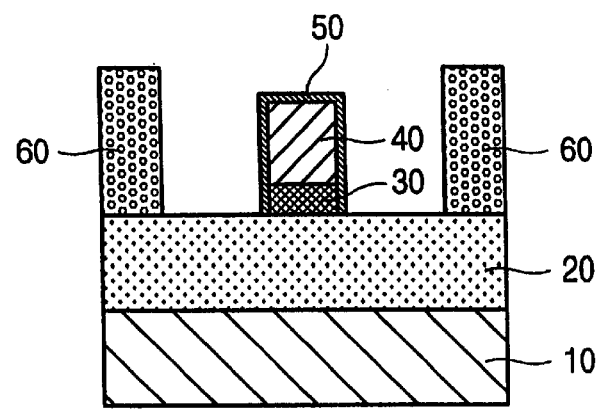

Referring to FIGS. 4A, 4B and 4C, an etch stop layer formed of silicon nitride is stacked on the active layer patterns 30 and 40 covered with the insulation layer 50. Preferably, the etch stop layer is a material having an etch selectivity with respect to the insulation layer 50. The etch stop layer can be formed of an amorphous silicon layer. But, the amorphous silicon layer should have etch selectivity with respect to the buried oxide layer 20. After stacking the etch stop layer, the etch stop layer is removed at the gate region through patterning process using a photo-lithography, to form the etch stop layer 60. At this time, while anisotropic etching is performed, the insulation layer 50 covering the active layer patterns 30 and 40, that is, thermal oxide layer, and the buried oxide layer 20 become the etch stop layer. The gate region is formed to the direction crossing the active layer patterns 30 and 40, and overlapped with the middle part of the active layer patterns 30 and 40, that is, with a channel region. Thus, as the gate stop layer is removed at the gate region, the channel region of the active layer patterns 30 and 40 covered with the insulation layer 50 is exposed.

Figure 5A:
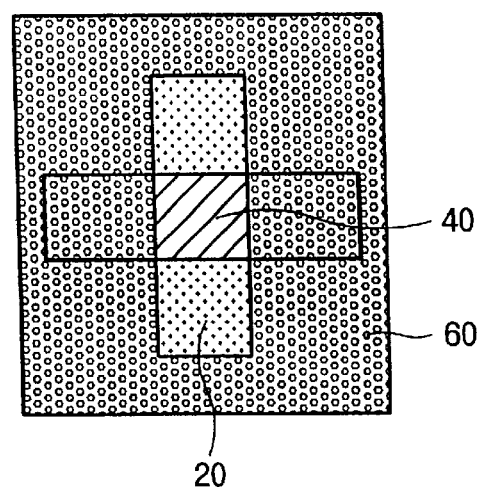
Figure 5B:
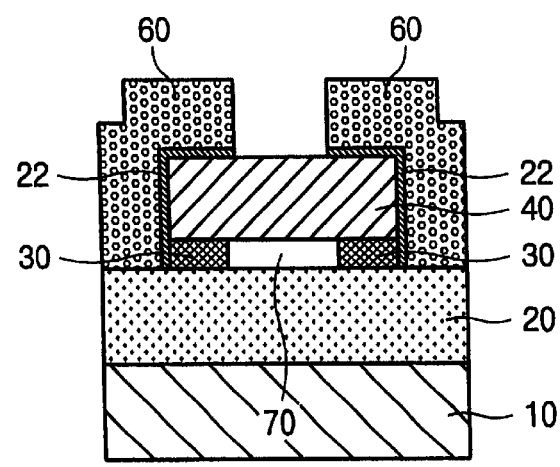
Figure 5C:
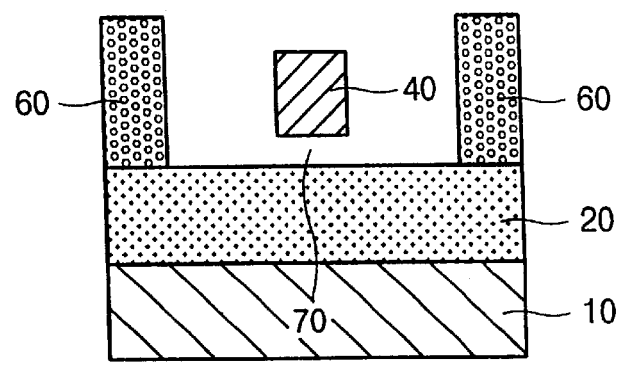

Referring to FIGS. 5A, 5B, and 5C, the insulation layer covering the exposed channel region of the active layer patterns 30 and 40, that is, thermal oxide layer is removed. In order to remove the thermal oxide layer, it is preferred to use wet-etching employing diluter fluoric acid than the anisotropic etch, or other isotropic etch. Thus, an insulation layer 22 of source/drain regions only remains. Then, in the middle of the active layer patterns 30 and 40 of the exposed channel region, the lower active layer pattern 30 formed of the silicon germanium single crystal layer is selectively etched and removed to form an empty space 70. Preferably, the lower active layer pattern 30 is formed of 20% or 30% of germanium by weight using silane and germane gases as a source gas in the growth process.

In order to selectively etch the lower active layer pattern 30 in the channel region, isotropic etch should be necessarily used. In case of using dryetching, it is preferred that plasma be formed using an etchant such as $SF_6$ for increase in etch degree. Under conditions of 40% of germanium content by weight, isotropic etching, temperature 75° C. and using a mixture of ammonium hydroxide ($NH_4OH$), hydrogen peroxide ($H_2O_2$) and pure water ($H_2O$) with the ratio 1:1:5 as the etchant, the etch selectivity of the germanium silicon single crystal layer and the silicon single crystal layer with respect to the etchant is 33:1, and the etch selectivity of the silicon germanium layer and the silicon oxide layer with respect to the etchant is 100:1. In case of using a mixture plasma of the $SF_6$ and oxygen as the etchant, the etch selectivity of the silicon germanium and the silicon with respect to the etchant can be sustained with 12:1. Other atomic layer etching techniques can be used. These etching methods can be used by themselves, or in combination.

Figure 6A:
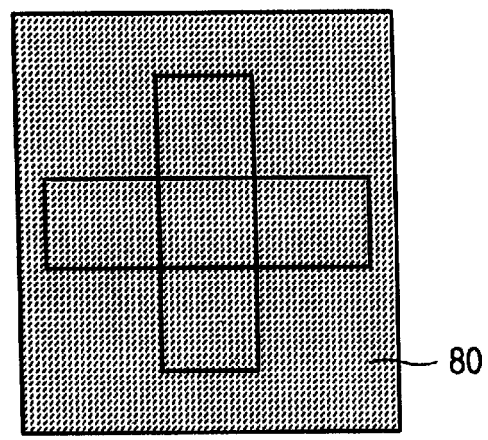
Figure 6B:
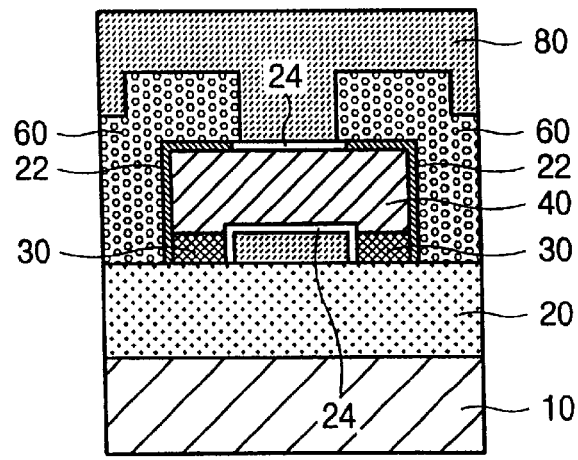
Figure 6C:
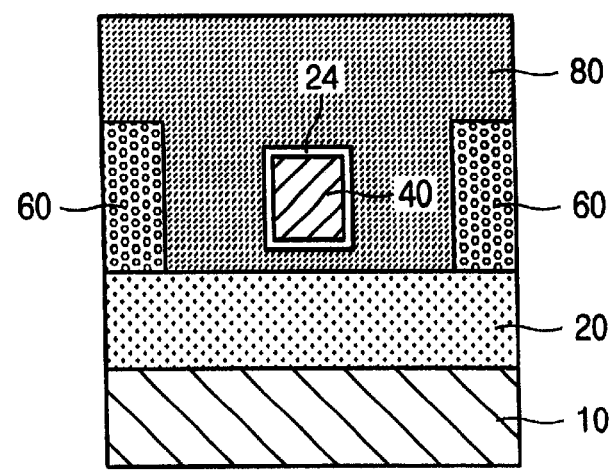

Referring to FIGS. 6A, 6B and 6C, after the lower active layer pattern 30 formed of the silicon germanium single crystal layer is removed at the channel region, a channel part insulation layer 24 functioning of the gate insulation layer is formed on the exposed surface of the active layer patterns 30 and 40. Conventionally, the gate insulation layer is formed of thermal oxide layer or thermal nitride layer through thermal oxidation or thermal nitrification. Alternatively, the gate insulation layer can be formed of an aluminum oxide layer, tantalum oxide layer, titanium oxide layer, zirconium oxide layer, hafnium oxide layer or other high dielectrics by using the CVD technique having a good step-coverage or an atomic layer deposition (ALD) technique. Before forming the channel part insulation layer 24, hydrogen heat-treatment can be performed in order to alleviate the problem that the upper active layer pattern 40 composed of the silicon single crystal layer of the channel region may be angled. Thickness of the channel part insulation layer 24 varies with a function of a transistor device, but should be 10 Å to 50 Å at a drive circuit device.

A conductivity material layer 80 composing the gate electrode is stacked on the semiconductor substrate by the CVD technique. Thus, the gate region where the etch stop layer is removed, including the empty space 70 between the upper active layer pattern 40 of the channel region and the buried oxide layer 20, is filled with a conductivity material layer 80. Preferably, the conductivity material layer 80 should be formed not to have any gap using a material having a superior gap-fill capability by the CVD technique. As the conductivity material, polysilicon, polysilicon germanium, tungsten, tungsten nitride, a dual layer of a titanium nitride layer and tungsten, aluminum, molybdenum, and tantalum can be used.

Figure 7A:
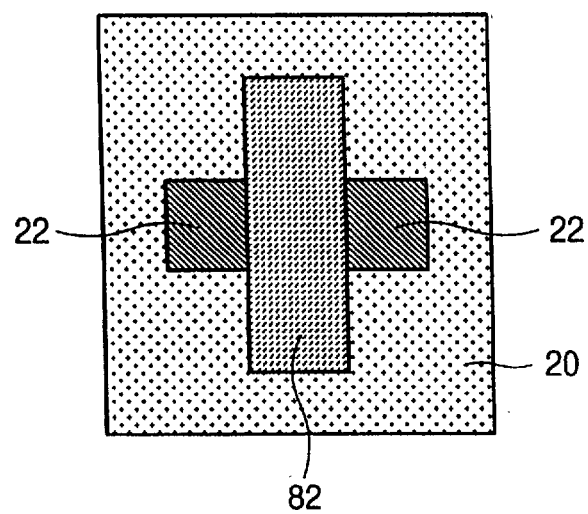
Figure 7B:
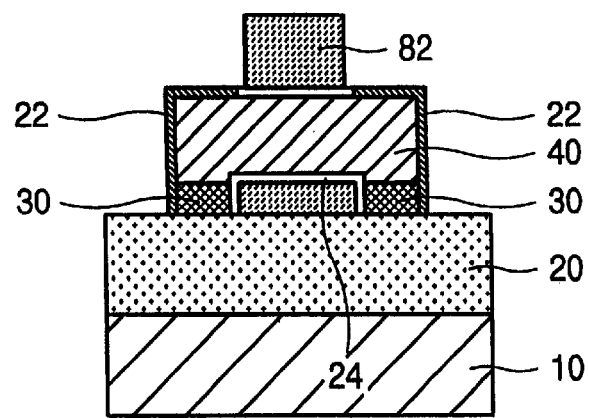
Figure 7C:
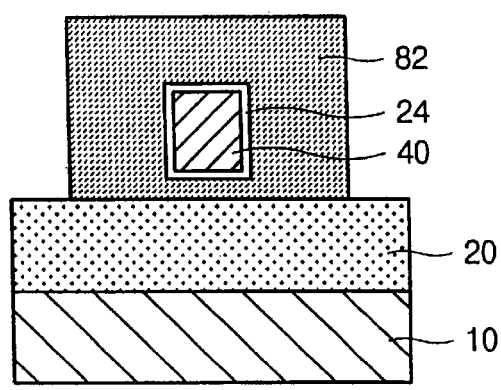

Referring to FIGS. 7A, 7B and 7C, the conductivity material layer 80 stacked on the etch stop layer pattern 60 defining the gate region, is removed by an entire surface anisotropic etch or the CMP technique. Thus, the etch stop layer is exposed. The etch stop layer is removed from the entire substrate through a phosphoric wet-etching. Thus, the channel region of the lower active layer pattern 40 is interposed between the channel part insulation layers 24, and this is surrounded with the gate electrode 82. Therefore, the transistor of the gate all around (GAA) structure is formed. As the conductivity material forming the gate electrode, polysilicon or CVD tungsten can be used.

Subsequently, ion-implantation can be performed into the source/drain regions of the active layer pattern, an interlayer insulation layer is stacked, and a contact hole is formed on the interlayer insulation layer. Thus, contacts can be formed at source/drain reigns and gate electrodes, respectively.

<Embodiment 2>

Figure 8A:
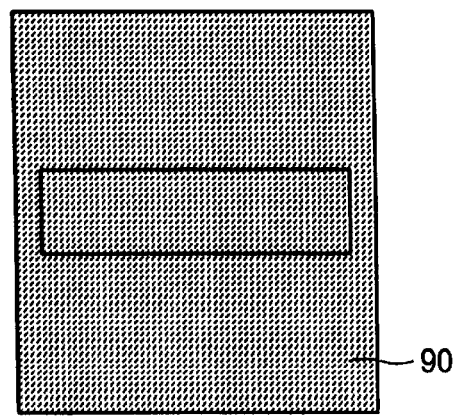
FIGS. 8A and 9A are plan views illustrating certain process steps in accordance with a second embodiment of the present invention.
Figure 8B:
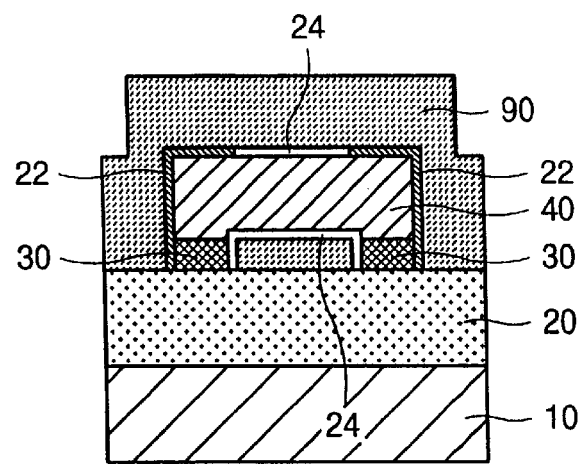
FIGS. 8B and 9B are cross-sectional views taken along the X–X' axis of FIGS. 8A and 9A, respectively.
Figure 8C:
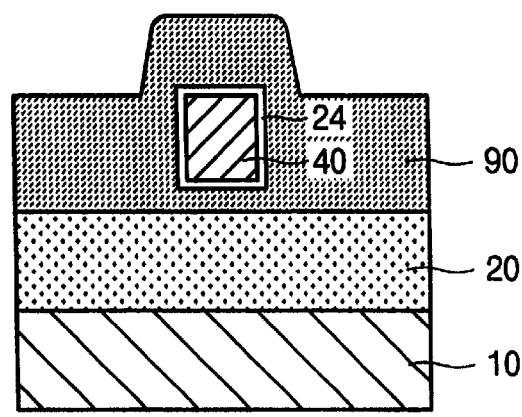
FIGS. 8C and 9C are cross-sectional views taken along the Y–Y' axis of FIGS. 8A and 9A, respectively.

FIGS. 8A through 9C show another embodiment of the present invention. Referring to FIGS. 8A, 8B, and 8C, at the step where the lower active layer pattern 30 formed of the silicon germanium single crystal layer is selectively removed at the channel region as illustrated in FIG. 5A, the surface of the channel region of the exposed upper active layer pattern 40 is oxidized to form the gate insulation layer, that is, the channel part insulation layer 24. And, the etch stop layer pattern 60 is entirely removed by wet-etching. At this state, the conductivity material layer 90 forming the gate electrode is stacked. At this time, the empty space 70 formed by selectively removing the lower active layer pattern of the channel region is filled with the conductivity material 90.

Figure 9A:
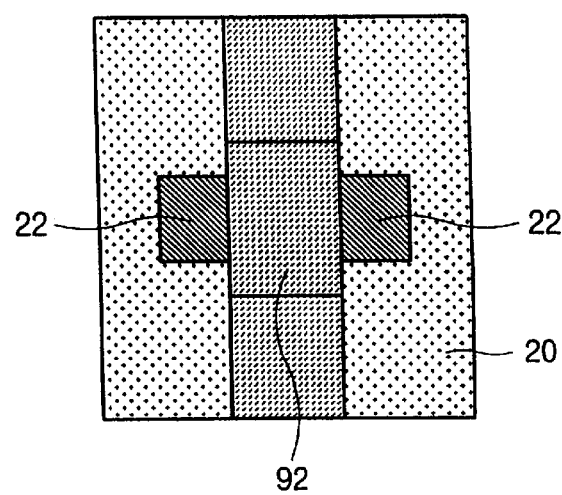
Figure 9B:
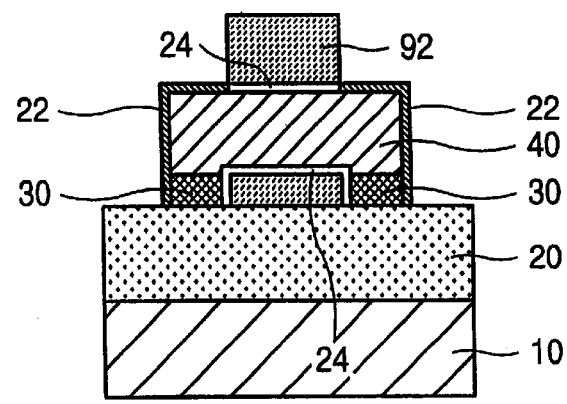
Figure 9C:
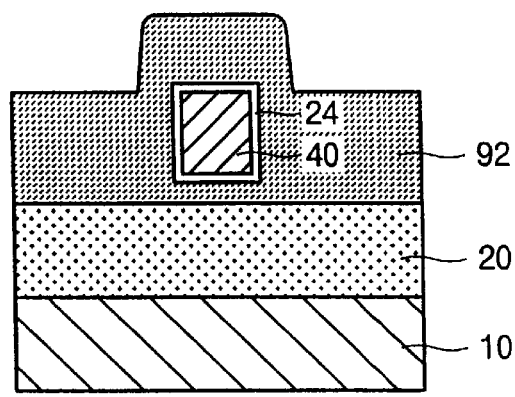

Referring to FIGS. 9A, 9B, and 9C, gate pattern is formed by a photoresist that is not illustrated at the substrate stacked with the conductivity material 90 and this is anisotropically etched to form a gate electrode 92 at the gate region. Thus, the active layer pattern 40 is interposed between the gate insulation layers 24 and this is surrounded by the gate electrode 92 to form a transistor of gate all around (GAA) structure.

<Embodiment 3>

Figure 10A:
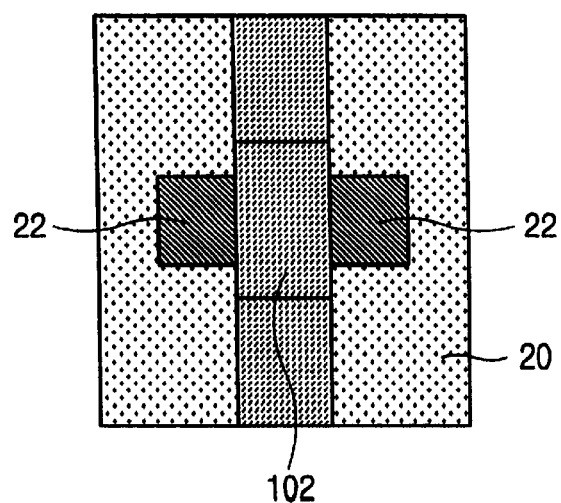
FIGS. 10A through 10C are plan and cross-sectional views of a device in accordance with another embodiment of the present invention.
Figure 10B:
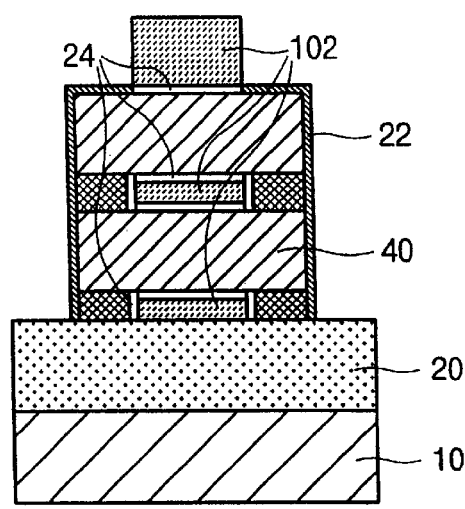
Figure 10C:
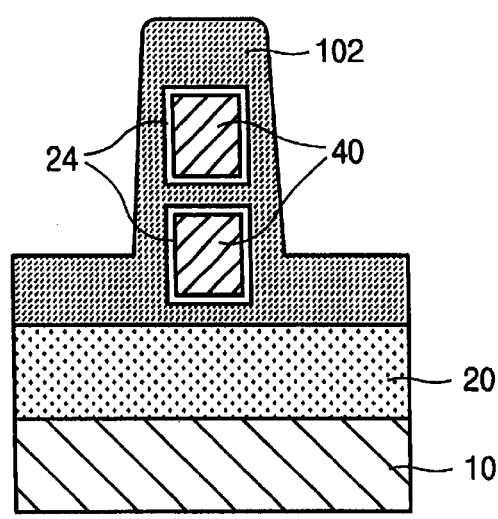

Referring to FIGS. 10A, 10B, and 10C, a transistor of gate all around (GAA) structure is illustrated in accordance with another embodiment of the present invention. The method of fabricating the transistor in the third embodiment is similar to the first embodiment except for using a SOI substrate having a SOI layer that consists of two unit dual layers of the silicon germanium layer and the silicon layer. The method of fabricating the transistor includes the following steps. That is, a SOI substrate consisting of a SOI layer, a buried oxide layer and a lower substrate layer is prepared. The SOI layer consists of two unit dual layers by overlapping the silicon germanium layer and the silicon layer. The SOI layer is patterned to form an active layer pattern to a certain direction. An insulation layer is formed to cover the surface of the active layer pattern, and an etch stop layer is stacked on the active layer pattern covered with the insulation layer. The etch stop layer is patterned and removed at the gate region crossing the active layer pattern at the channel region. The insulation layer is removed at the gate region, and the silicon germanium layer is selectively removed at the channel region of the active layer pattern by the isotropic etch. At this time, two cavities are formed at two positions differently from the above-preferred embodiments. In the state that the silicon germanium is selectively removed, a gate insulation layer 24 is formed to cover the exposed surface of the active layer pattern, and the etch stop layer pattern is removed. A conductivity material layer is stacked at the entire surface of the substrate by the CVD to fill the two cavities and cover the active layer pattern. This is patterned, the conductivity material layer remains at the gate region, and thus, a gate electrode 102 is formed.

<Embodiment 4>

Figure 11A:
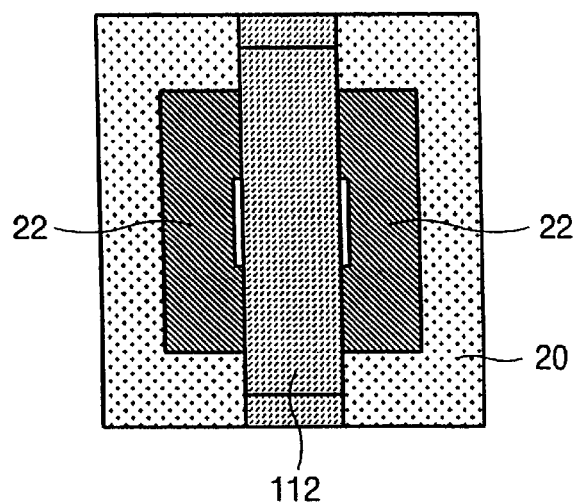
FIGS. 11A through 11C are plan and cross-sectional views of a device in accordance with another embodiment of the present invention.
Figure 11B:
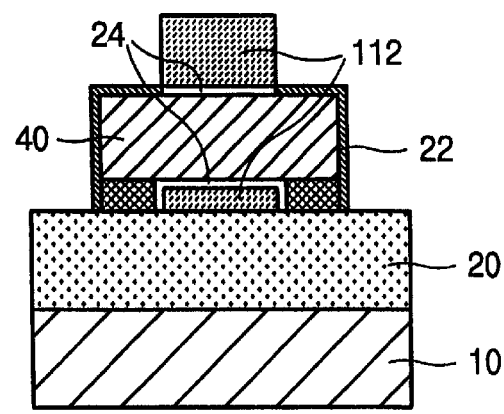
Figure 11C:
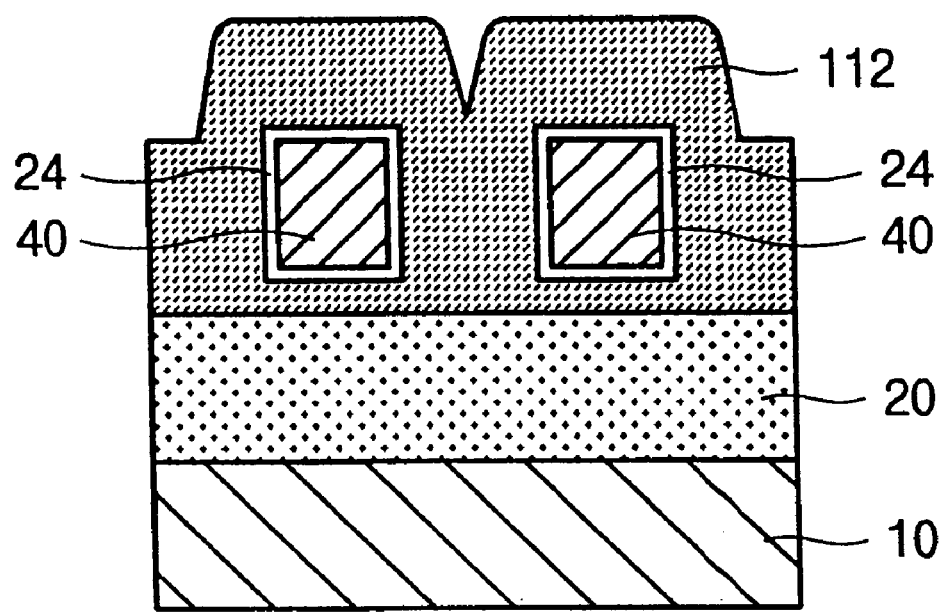

Referring to FIGS. 11A, 11B, and 11C, a transistor of gate all around (GAA) structure is illustrated in accordance with another embodiment of the present invention.

The method of fabricating the transistor in accordance with the present embodiment is similar to the second embodiment except for the following step. That is, at the step of forming the active layer pattern by patterning the SOI layer, an active layer pattern is formed as illustrated in FIG. 11A where the source/drain regions are combined and the channel region is separated by two parts.

According to the third and fourth embodiments, there is an effect that channel width of a transistor is widened by forming a channel divided with multiple parts.

According to the present invention, a silicon germanium layer is selectively removed at a channel region of an active layer pattern using an etch selectivity of a silicon layer and a silicon germanium layer. A conductivity material is filled in the region where the silicon germanium layer is selectively removed, and thereby, a transistor of gate all around (GAA) structure is formed. Thus, there are effects of widening a channel width of a transistor at a highly integrated semiconductor device, and at the same time, decreasing degradation of product reliability according to a problem of a process or damage of a channel layer.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of fabricating a semiconductor device having a transistor comprising:
    preparing a SOI substrate including a SOI layer, a buried oxide layer, and a lower substrate layer, the SOI layer having at least one unit dual layer formed of a silicon germanium layer and a silicon layer;
    patterning the SOI layer to form an active layer pattern in a certain direction;
    forming an insulation layer covering the surface of the active layer pattern;
    stacking an etch stop layer on the active layer pattern covered with the insulation layer;
    patterning and removing the etch stop layer at a gate region crossing the active layer pattern at the channel region to form an etch stop layer pattern;
    removing the insulation layer at the gate region;
    isotropically etching and selectively removing the silicon germanium layer to form a cavity at the channel region of the active layer pattern;
    forming a gate insulation layer to cover the exposed surface of the active layer pattern at the substrate where the silicon germanium layer is selectively removed; and
    stacking a conductivity material layer at the substrate where the gate insulation layer is formed and thereby forming a gate electrode at the gate region including the cavity.

2. The method of claim 1, wherein the step of forming the gate electrode comprises:
    stacking the conductivity material layer;
    planarization-etching the conductivity material layer to expose the top surface of the etch stop layer pattern; and
    etching and removing the etch stop layer pattern.

3. The method of claim 1, wherein the step of forming the gate electrode comprises:
    etching and removing the etch stop layer pattern;
    stacking the conductivity material layer; and
    pattering the conductivity material layer.

4. The method of claim 1, wherein, during the step of patterning the SOI layer, the active layer pattern is patterned to be divided by multiple parts at the channel region.

5. The method of claim 1, wherein the insulation layer and the gate insulation layer are made by thermal oxidation to have different thickness.

6. The method of claim 1, wherein the isotropic etching is performed by a combination of dry-plasma etching and wet-etching.

7. A method of fabricating a semiconductor device having a transistor comprising:
    preparing a SOI substrate including a SOI layer, a buried oxide layer, and a lower substrate layer, the SOI layer having at least one unit dual layer formed of a silicon germanium layer and a silicon layer;
    patterning the SOI layer to form an active layer pattern in a certain direction;
    stacking an etch stop layer on the active layer pattern;
    patterning and removing the etch stop layer at a gate region crossing the active layer pattern at the channel region to form an etch stop layer pattern;
    isotropically etching and selectively removing the silicon germanium layer to form a cavity at the channel region of the active layer pattern;
    forming a gate insulation layer to cover the exposed surface of the active layer pattern at the substrate where the silicon germanium layer is selectively removed; and
    stacking a conductivity material layer at the substrate where the gate insulation layer is formed and thereby, forming a gate electrode at the gate region including the cavity.

* * * * *

UNITED STATES PATENT AND TRADEMARK OFFICE
CERTIFICATE OF CORRECTION

PATENT NO. : 6,794,306 B2
DATED : September 21, 2004
INVENTOR(S) : Sang-Su Kim et al.

It is certified that error appears in the above-identified patent and that said Letters Patent is hereby corrected as shown below:

<u>Title page,</u>
Item [62], Related U.S. Application Data, please change "10/039,151, is listed as January 3, 2003." should read -- 10/039,151 is January 3, 2002. --

Signed and Sealed this

Twenty-second Day of March, 2005

JON W. DUDAS
*Director of the United States Patent and Trademark Office*